United States Patent
Shono et al.

(10) Patent No.: US 10,410,738 B2
(45) Date of Patent: Sep. 10, 2019

(54) MEMORY SYSTEM AND CONTROL METHOD

(71) Applicant: TOSHIBA MEMORY CORPORATION, Minato-ku (JP)

(72) Inventors: Atsuo Shono, Kamakura (JP); Katsuhiko Ueki, Katsushika (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 37 days.

(21) Appl. No.: 15/261,008

(22) Filed: Sep. 9, 2016

(65) Prior Publication Data
US 2017/0269996 A1 Sep. 21, 2017

Related U.S. Application Data

(60) Provisional application No. 62/308,421, filed on Mar. 15, 2016.

(51) Int. Cl.
*G06F 11/10* (2006.01)
*G11C 29/52* (2006.01)
*G11C 29/04* (2006.01)

(52) U.S. Cl.
CPC .......... *G11C 29/52* (2013.01); *G06F 11/1048* (2013.01); *G11C 2029/0409* (2013.01); *G11C 2029/0411* (2013.01)

(58) Field of Classification Search
CPC ............. G06F 11/1076; G06F 11/1008; G06F 11/106; G06F 11/1068; G06F 3/0634; G06F 3/0619; G06F 3/064; G06F 3/0679; H05K 999/99; G11C 2029/0411; G11C 29/52; G11C 2029/0409

USPC .......................................................... 714/764
See application file for complete search history.

(56) References Cited

U.S. PATENT DOCUMENTS

| | | | | |
|---|---|---|---|---|
| 6,216,247 B1 * | 4/2001 | Creta | ...................... | G06F 11/10 714/42 |
| 7,676,728 B2 * | 3/2010 | Resnick | ................ | G06F 11/106 711/105 |
| 8,386,905 B2 * | 2/2013 | Chu | ..................... | G06F 11/1048 714/758 |
| 8,422,303 B2 | 4/2013 | Franca-Neto et al. | | |
| 8,677,216 B2 * | 3/2014 | Park | ..................... | G06F 11/1044 714/764 |

(Continued)

FOREIGN PATENT DOCUMENTS

JP 2015-43183 3/2015

*Primary Examiner* — Samir W Rizk
*Assistant Examiner* — Enam Ahmed
(74) *Attorney, Agent, or Firm* — Oblon, McClelland, Maier & Neustadt, L.L.P.

(57) ABSTRACT

According to one embodiment, a memory system includes a memory, an error correcting circuit and a memory controller. The memory includes a memory cell which is writable in a memory mode including a first mode and a second mode. The first mode is a mode in which a value of bits is written to the memory cell. The second mode is a mode in which a value of bits smaller than that in the first mode is written to the memory cell. The memory controller controls a coding rate for the error correction on the basis of result of error correction. The controller sets the first mode as the memory mode to be used. The controller changes the memory mode to be used from the first mode to the second mode in a case where the coding rate is less than a first threshold.

20 Claims, 15 Drawing Sheets

(56) References Cited

U.S. PATENT DOCUMENTS

| | | | |
|---|---|---|---|
| 8,762,814 B2* | 6/2014 | Yang | G06F 11/1012 |
| | | | 714/764 |
| 8,972,819 B2* | 3/2015 | Morris | G06F 11/0793 |
| | | | 714/758 |
| 9,432,298 B1* | 8/2016 | Smith | H04L 49/9057 |
| 9,570,197 B2* | 2/2017 | Nishiyama | G11C 29/10 |
| 9,679,661 B1* | 6/2017 | Guo | G11C 7/062 |
| 2007/0234142 A1* | 10/2007 | Aizawa | G06F 11/1068 |
| | | | 714/718 |
| 2009/0213645 A1* | 8/2009 | Parkinson | G11C 11/56 |
| | | | 365/163 |
| 2012/0047409 A1* | 2/2012 | Post | G06F 11/1048 |
| | | | 714/718 |
| 2012/0311408 A1* | 12/2012 | Nakanishi | G06F 11/1048 |
| | | | 714/773 |
| 2013/0138870 A1* | 5/2013 | Yoon | G11C 11/5621 |
| | | | 711/103 |
| 2013/0166990 A1* | 6/2013 | Morris | G06F 11/0793 |
| | | | 714/764 |
| 2015/0153957 A1 | 6/2015 | Shibayama et al. | |
| 2015/0227420 A1* | 8/2015 | Oh | G11C 29/52 |
| | | | 714/764 |
| 2015/0278004 A1* | 10/2015 | Li | G11C 29/42 |
| | | | 714/6.11 |
| 2017/0004031 A1* | 1/2017 | Dick | G06F 11/1068 |
| 2017/0079219 A1* | 3/2017 | Stanley | A01G 23/00 |
| 2017/0147262 A1* | 5/2017 | Lee | G06F 3/0604 |

\* cited by examiner ial Application No. 62/308,421,
MEMORY SYSTEM AND CONTROL METHOD

CROSS-REFERENCE TO RELATED APPLICATIONS

This application is based upon and claims the benefit of priority from U.S. Provisional Application No. 62/308,421, filed on Mar. 15, 2016; the entire contents of which are incorporated herein by reference.

FIELD

Embodiments described herein relate generally to a memory system and a control method.

BACKGROUND

Conventionally, a scheme that a value of plural bits is stored in a single memory cell transistor is known as a technique of increasing capacity of a NAND type flash memory. For example, a flash memory employing a multi level cell (MLC) scheme can store a value of two bits in a single memory cell transistor. For example, a flash memory employing a triple level cell (TLC) scheme can store a value of three bits in a single memory cell transistor.

DETAILED DESCRIPTION

In general, according to one embodiment, a memory system includes a nonvolatile memory, an error correcting circuit and a memory controller. The nonvolatile memory includes a memory cell which is writable in a memory mode including a first mode and a second mode. The first mode is a mode in which a value of a plurality of bits is written to the memory cell. The second mode is a mode in which a value of the number of bits smaller than that in the first mode is written to the memory cell. The error correcting circuit performs error correction on data read from the memory. The memory controller controls a coding rate for the error correction on the basis of result of the error correction. The controller sets the first mode as the memory mode to be used. The controller changes the memory mode to be used from the first mode to the second mode in a case where the coding rate is less than a first threshold.

Exemplary embodiments of a memory system and a control method will be explained below in detail with reference to the accompanying drawings. The present invention is not limited to the following embodiments.

(First Embodiment)

Figure 1:
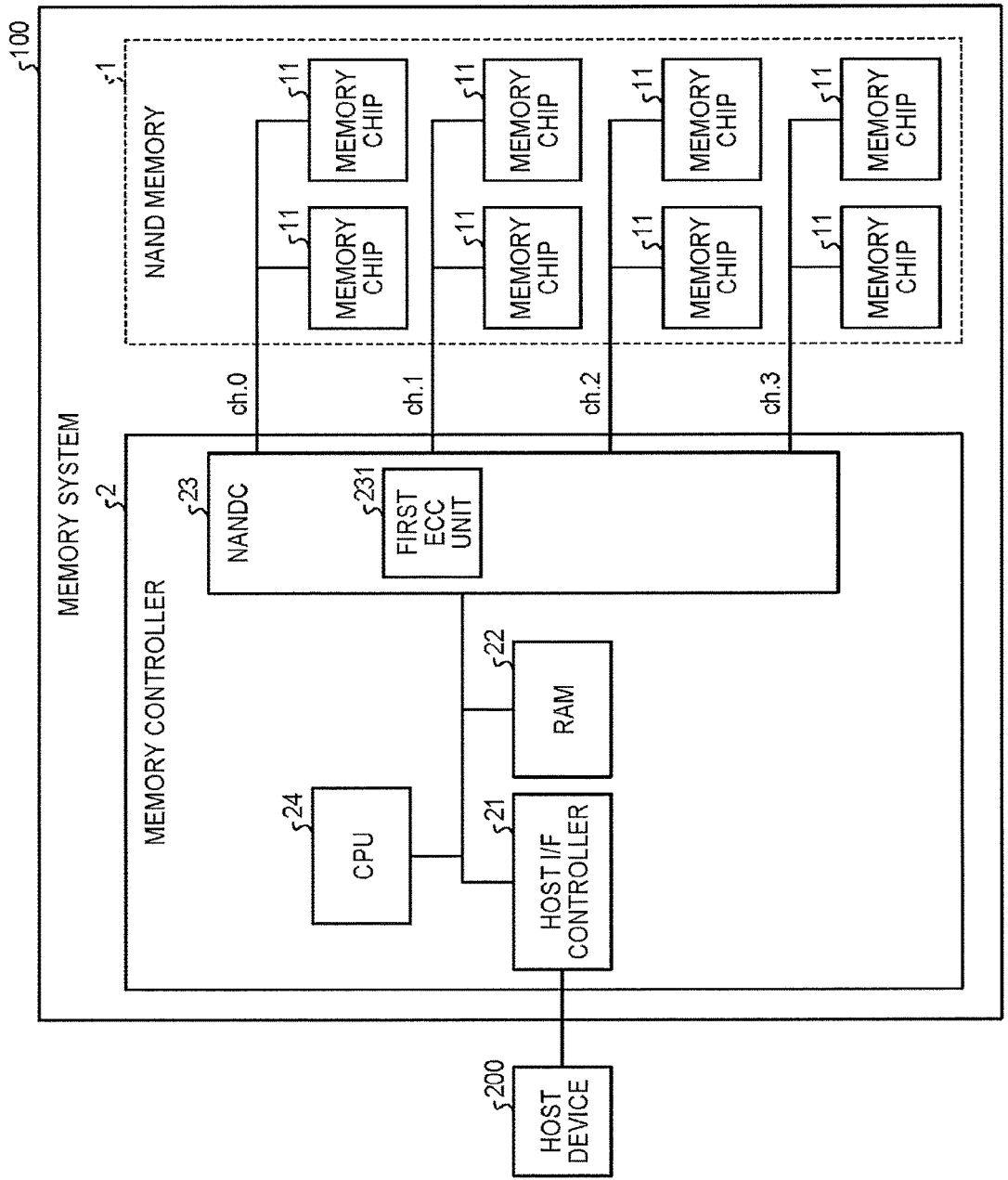
FIG. 1 is a diagram illustrating an example of a configuration of a memory system according to a first embodiment.

FIG. 1 is a diagram illustrating an example of a configuration of a memory system according to a first embodiment. A memory system 100 is connected to a host device 200 (hereinafter, referred to as a host 200) via a communication interface based on a serial advanced technology attachment (SATA) standard, a serial attached SCSI (SAS) standard, or a peripheral components interconnect (PCI) express standard. The host 200 corresponds to, for example, a processor or a peripheral device in a server (server system), a personal computer, a mobile information processing device, or the like. The memory system 100 serves as an external storage device of the host 200. The host 200 can issue an access request (a reading request and a writing request) to the memory system 100.

The memory system 100 includes a NAND type flash memory (NAND memory) 1 as a storage memory and a memory controller 2 transmitting data between the host 200 and the NAND memory 1. The memory system 100 may include different type of memory instead of the NAND memory 1 as a storage memory as long as it is nonvolatile. For example, the memory system 100 may include a NOR type flash memory instead of the NAND memory 1.

The NAND memory 1 includes plural (eight in FIG. 1) memory chips 11 as semiconductor memories. The memory controller 2 includes four channels (ch. 0 to ch. 3) for the NAND memory 1. Two memory chips 11 are connected to each channel. Each channel includes a control signal line, an I/O signal line, a chip-enable (CE) signal line, and an RY/BY signal line. The I/O signal line is a signal line for transmitting data, addresses, and various instructions. The memory controller 2 can transmit a reading instruction, a programming instruction, and an erasing instruction to the memory chips 11 via the I/O signal line. The control signal line includes a write-enable (WE) signal line, a read-enable (RE) signal line, a command latch-enable (CLE) signal line, an address latch-enable (ALE) signal line, and a writing-prevention (WP) signal line. The memory controller 2 can control two memory chips 11 connected to any one channel independently of the memory chips 11 connected to another channel because the signal lines of the channels are independent of each other. Since two memory chips 11 connected to the same channel shares a signal line group, the two memory chips 11 are accessed from the memory controller 2 at different timings.

Figure 2:
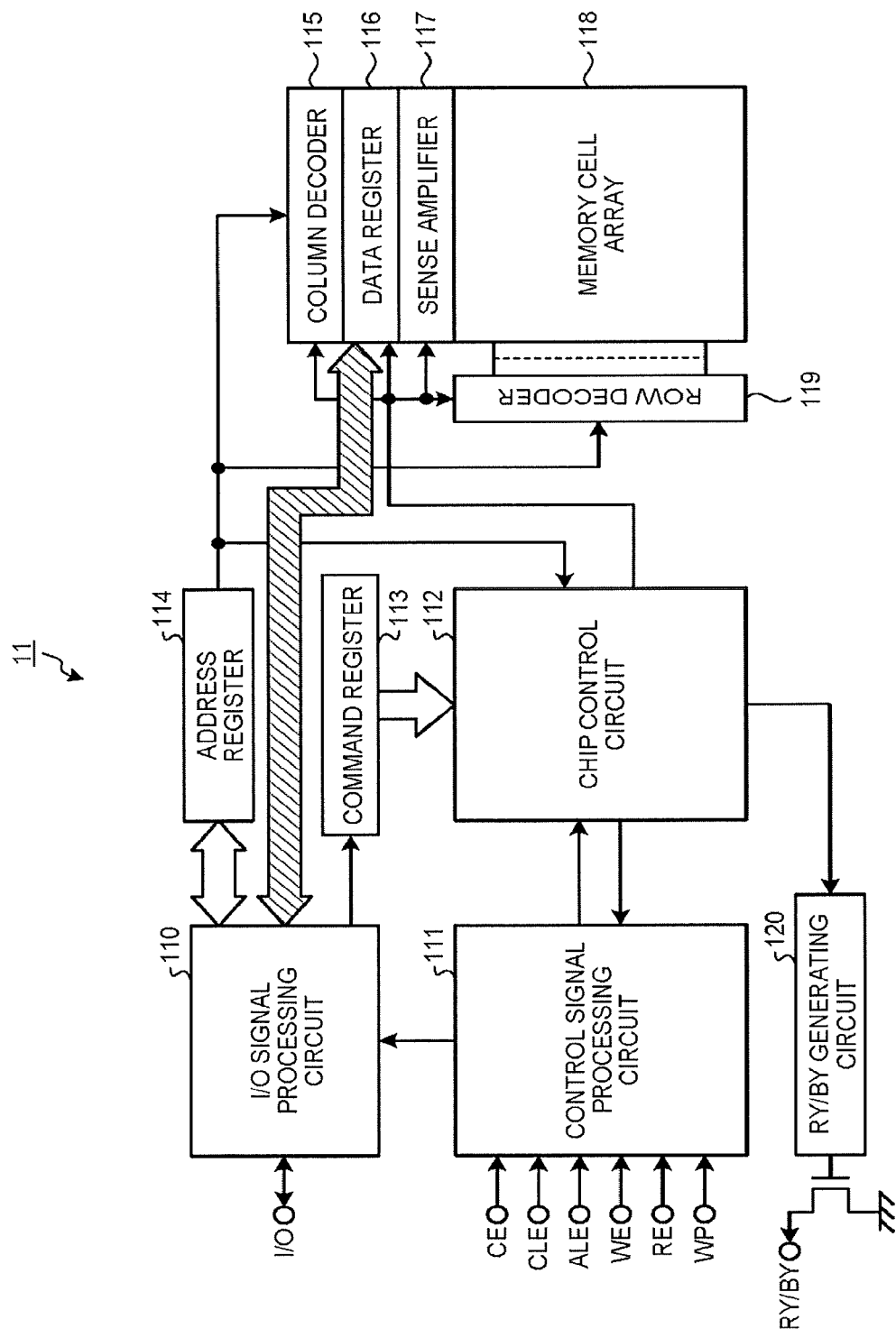
FIG. 2 is a diagram illustrating an example of a configuration of each memory chip.

FIG. 2 is a diagram illustrating an example of a configuration of each memory chip 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generating circuit 120.

The chip control circuit 112 is a state transition circuit that transitions in state on the basis of various control signals which are received via the control signal processing circuit 111. The chip control circuit 112 controls entire operation of the memory chips 11. The RY/BY generating circuit 120 causes a state of the RY/BY signal line to transition between a ready state (RY) and a busy state (BY) under the control of the chip control circuit 112.

The I/O signal processing circuit 110 includes a buffer circuit for transmitting and receiving an I/O signal to and from the memory controller 2. A command, an address for designating an access destination, and data which are latched by the I/O signal processing circuit 110 are distributed and stored in the command register 113, the address register 114, and the data register 116.

Addresses stored in the address register 114 include a chip address, a row address, and a column address sequentially from a higher side. The chip address is identification information for identifying the memory chips 11. The chip address is read to the chip control circuit 112, the row address is read to the row decoder 119, and the column address is read to the column decoder 115.

The control signal processing circuit 111 receives an input of a control signal. The control signal processing circuit 111 distributes registers of destinations of the I/O signals received by the I/O signal processing circuit 110 on the basis of the received control signal. The control signal processing circuit 111 transmits the received control signal to the chip control circuit 112.

The memory cell array 118 includes plural blocks as units of erasing.

Figure 3:
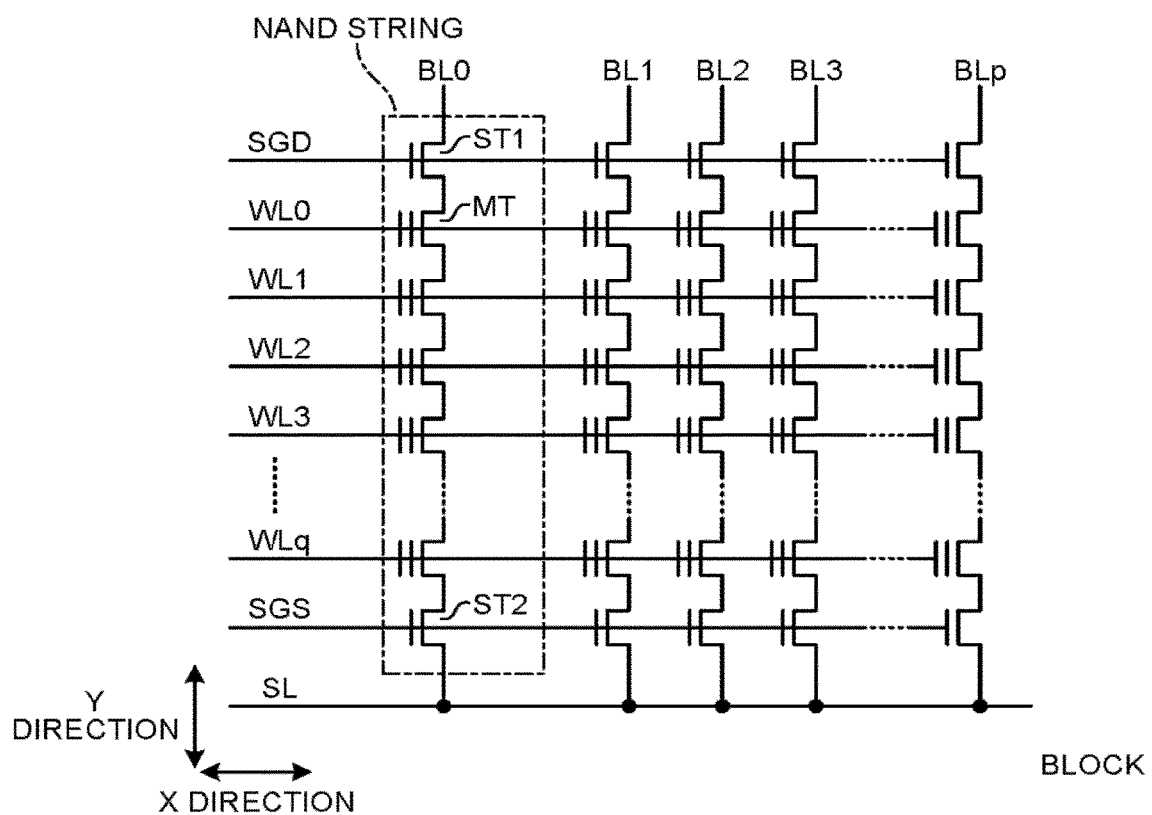
FIG. 3 is a circuit diagram illustrating an example of a configuration of one block included in a memory cell array.

FIG. 3 is a circuit diagram illustrating an example of a configuration of one block of the plural blocks included in the memory cell array 118. As illustrated in the drawing, each block includes (p+1) NAND strings which are arranged sequentially in the X direction (p≥0). In a selection transistor ST1 included in each of the (p+1) NAND strings, the drain is connected to bit lines BL0 to BLp and the gate is connected commonly to a selection gate line SGD. In a selection transistor ST2, the source is connected commonly to a source line SL and the gate is commonly connected to a selection gate line SGS.

Each memory cell transistor MT is constituted by a metal oxide semiconductor field effect transistor (MOSFET) having a stacked gate structure formed on a semiconductor substrate. Hereinafter, a memory cell transistor MT is simply referred to as a memory cell. The stacked gate structure includes a floating gate formed on the semiconductor substrate with a tunneling oxide film interposed therebetween and a control gate electrode formed on the floating gate with an inter-gate insulating film interposed therebetween. A threshold voltage varies depending on the number of electrons accumulated in the floating gate. The memory cell stores data depending on a difference between threshold voltages. That is, the memory cell holds an amount of electric charges corresponding to the value of data in the floating gate.

In each NAND string, (q+1) memory cells are arranged such that current paths are connected in series between the source of the selection transistor ST1 and the drain of the selection transistor ST2 (q≥0). Sequentially from the memory cell located closest to the drain, the control gate electrodes are connected to word lines WL0 to WLq. Accordingly, the drain of the memory cell MT connected to the word line WL0 is connected to the source of the selection transistor ST1, and the source of the memory cell connected to the word line WLq is connected to the drain of the selection transistor ST2.

The word lines WL0 to WLq commonly connect the control gate electrodes of the memory cells between the NAND strings in the block. That is, the control gate electrodes of the memory cells in the same row in the block are connected to the same word line WL. When one memory cell holds a value of one bit, the (p+1) memory cells connected to the same word line WL are handled as one page and data programming and data reading are performed for each page.

Each memory cell holds a value of n (n≥1) bits or more. A mode in which n is 1 is referred to as a single level cell (SLC). When each memory cell holds a value of n bits, the storage capacity of each word line WL is equal to a size corresponding to n pages. A mode in which n is 2 is referred to as an MLC. A mode in which n is 3 is referred to as a TLC. A mode in which n is 4 is referred to as a quad level cell (QLC). These modes in which values of n bits are held in one memory cell are referred to as memory modes.

A threshold voltage of each memory cell is controlled within a certain range. A controllable range of the threshold voltage is divided into $2^n$ sections and different values are assigned to the sections.

Figure 4:
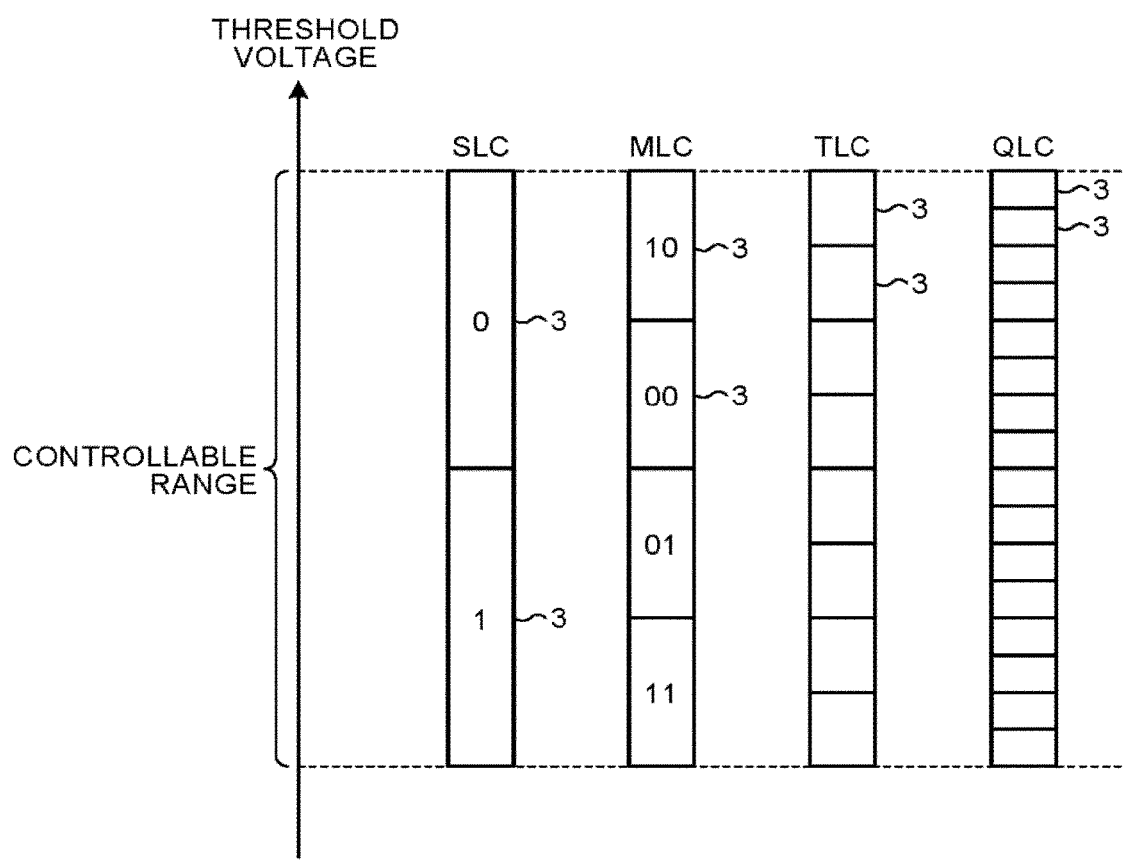
FIG. 4 is a diagram illustrating sections when a value of one or more bits is stored in each memory cell.

FIG. 4 is a diagram illustrating sections in a case where a value of one bit or more is held in each memory cell. As illustrated in the drawing, the range of the threshold voltage (controllable range) is divided into plural sections 3. For example, in a case of the SLC, the range of the threshold voltage is divided into two sections 3. In a case of the MLC, the range of the threshold voltage is divided into four sections 3. In a case of the TLC, the range of the threshold voltage is divided into eight sections 3. In a case of the QLC, the range of the threshold voltage is divided into sixteen sections 3. The larger the number of bits of the value held in one memory cell becomes, the smaller the size of one section 3 becomes. Values are assigned to the sections 3. In the SLC, a value "1" is assigned to the section 3 on the low voltage side, and a value "0" is assigned to the section 3 on the high voltage side. In the MLC, a value "11" is assigned to the section 3 on the lowest voltage side and values "01," "00," and "10" are assigned to the other three sections 3 in the order of voltages. The method of assigning values to the sections 3 is not limited to the above-mentioned example. The number of bits of a value held in one memory cell may be referred to as the number of levels.

Referring to FIG. 2 again, the row decoder 119, the column decoder 115, the data register 116, and the sense amplifier 117 constitute peripheral circuits. The peripheral circuits perform access to the memory cell array 118 (reading, programming, or erasing) under the control of the chip control circuit 112.

For example, in programming, the column decoder 115 selects and activates a bit line corresponding to the read column address. The sense amplifier 117 sets the potential of the bit line selected by the column decoder 115 to zero V. The row decoder 119 applies a programming pulse to the word line corresponding to a read row address. Then, electrons are injected into the floating gate of the memory cell located at an intersection of the selected bit line and the selected word line and thus the threshold voltage of the floating gate increases. The sense amplifier 117 checks whether the threshold voltage reaches a voltage corresponding to data stored in the data register 116 whenever the programming pulse is applied. The sense amplifier 117 continues to causes the row decoder 119 to apply the programming pulse until the threshold voltage reaches the voltage corresponding to the data value. In other words, the sense amplifier 117 controls the row decoder 119 until the threshold voltage reaches the section 3 corresponding to the data value.

In reading, the sense amplifier 117 pre-charges the bit line BL with a source potential Vcc and the row decoder 119 sequentially applies plural types of determination voltages for specifying the section 3 including the threshold voltage to the selected word line WL. The row decoder 119 applies a transfer potential to the non-selected word lines WL to turn on the memory cells belonging to the non-selected word lines WL. The sense amplifier 117 determines the section 3 including the threshold voltage of the target memory cell by detecting whether the electric charges accumulated by the pre-charging leaks to the source line SL which determination voltage is applied thereto. The sense amplifier 117 outputs the value corresponding to the determined section 3.

In erasing, an erasing voltage is applied to the substrate of the memory cell array 118 by a voltage generating circuit (not illustrated). Then, the row decoder 119 charges all the word lines WL to the block to be erased with a ground potential. Then, in the memory cells in the selected block, electric charges accumulated in the floating gates are discharged. As a result, the states of the memory cells in the selected block transitions to an erased state (that is, the section 3 on the lowest voltage side).

The sense amplifier 117 stores the read value in the data register 116. The value stored in the data register 116 is sent as read data to the I/O signal processing circuit 110 via the data line and data signal-processed in the I/O signal processing circuit 110 is transmitted to the memory controller 2.

The configuration of the memory cell array 118 is not limited to the above-mentioned configuration. For example, the memory cell array 118 may have a configuration in which the memory cells are three-dimensionally stacked on a semiconductor substrate.

Referring to FIG. 1 again, the memory controller 2 includes a host interface controller (host I/F controller) 21, a random access memory (RAM) 22, a NAND controller (NANDC) 23, and a central processing unit (CPU) 24. The host I/F controller 21, the RAM 22, the NANDC 23, and the CPU 24 are connected to each other via a bus.

The RAM 22 serves as a buffer for transmitting data between the host 200 and the NAND memory 1. The RAM 22 provides a work area to the CPU 24. The type of the RAM 22 is not particularly limited. For example, a dynamic random access memory (DRAM) or a static random access memory (SRAM) can be employed as the RAM 22.

The CPU 24 serves as a processing unit controlling the entire memory controller 2 on the basis of firmware. The firmware is stored in, for example, the NAND memory 1 in advance and is loaded onto the work area in the RAM 22 from the NAND memory 1 by the CPU 24 at the time of starting the memory system 100. The CPU 24 executes the firmware loaded onto the work area.

The host I/F controller 21 performs control of a communication interface between the host 200 and the memory system 100 and control of data transmission between the host 200 and the RAM 22 under the control of the CPU 24.

The NANDC 23 controls four channels (ch. 0 to ch. 3). The NANDC 23 performs control of data transmission between the NAND memory 1 and the RAM 22 under the control of the CPU 24.

The NANDC 23 includes a first ECC unit 231. The first ECC unit 231 performs coding for error correction on data to be programmed or performs error correction on data read from the NAND memory 1. A frame (first frame) for the error correction by the first ECC unit 231 can be constituted in any manner. For example, the first frame is constituted by one page. The first frame may be constituted by plural pages. The first frame may be constituted by data in a unit smaller than a page.

In each memory chip 11, an amount of electric charges held in each floating gate varies with the lapse of time. The amount of electric charges held in the floating gate varies by reading or programming to adjacent memory cells. By this phenomenon, the threshold voltage after being programmed varies and thus the value of data varies in programming and reading. The varied value is handled as an error. Specifically, the first ECC unit 231 tries to correct the error. An error occurrence rate in data read from the NAND memory 1 is referred to as a raw bit error rate (RBER).

Here, the smaller the size of one section becomes, the larger the influence of the variation in the threshold voltage becomes relatively, and thus there is a tendency that the RBER increases. As degradation of a memory cell progresses, the threshold voltage is likely to vary and thus the RBER is likely to increase.

According to the embodiment, a variable-length coding system is employed as a coding system of the first ECC unit 231. The variable-length coding is a system that can change a coding length depending on necessary correction capability. For example, BCH coding or low-density parity-check code (LDPC) coding can be employed as the coding system of the first ECC unit 231. The memory controller 2 can cope with the increase in the RBER by controlling a coding rate. The coding rate is a ratio of a size of data before being coded to a size of data after being coded. That is, the memory controller 2 controls the coding rate such that the coding rate decreases with the increase in the RBER.

Any method can be employed as the method of controlling the coding rate. For example, the CPU 24 decreases the coding rate when an evaluation value for changing the coding rate satisfies a certain condition (hereinafter, referred to as rate changing condition), and does not decrease the coding rate but maintains the rate when the evaluation value for changing the coding rate does not satisfies the rate changing condition. Examples of the evaluation value include the number of errors in a frame for correction by the first ECC unit 231 (hereinafter, referred to as first frame), an occurrence probability of an error in the first frame, a correction fail frequency by the first ECC unit 231, and a correction fail probability by the first ECC unit 231. For example, an error correction result (such as success or fail of error correction or the number of errors) is received from the first ECC unit 231 and the evaluation value is calculated on the basis of the received error correction result. An example of the method of controlling the coding rate will be specifically described below.

In an example of the method of controlling the coding rate, when the number of errors in the first frame or the error occurrence probability in the first frame is greater than a threshold at the time of reading data from a certain block, the CPU 24 changes the coding rate for the block to a smaller value. That is, in this example, the evaluation value is the number of errors in the first frame or the error occurrence probability in the first frame, and the rate changing condition is that the evaluation value is greater than the threshold.

In another example of the method of controlling the coding rate, the memory controller 2 additionally has a second error correcting function having higher correction capability than that in the first ECC unit 231. The second error correcting function has correction capability higher than the correction capability of the first ECC unit 231. The second error correcting function is realized by firmware or dedicated hardware. When the first ECC unit 231 fails in the error correction at the time of reading data from a certain block, the CPU 24 changes the coding rate for the block to a smaller value. In this example, the evaluation value is the error correction fail frequency by the first ECC unit 231 and the rate changing condition is that the error correction fail frequency by the first ECC unit 231 is equal to or greater than 1.

Here, the coding rate cannot decrease to be equal to or less than a certain value due to hardware limitation. According to the embodiment, the memory controller 2 can cope with this problem by changing the memory mode. The memory controller 2 decreases the number of levels when the coding rate is less than a certain threshold (hereinafter, referred to as a threshold rate). For example, it is assumed herein that the threshold rate is a lower limit of the controllable range of the coding rate. That is, when the coding rate reaches the threshold rate and cannot be changed to a smaller value, the memory mode is changed. Since the size of one section increases by decreasing the number of levels, the RBER immediately after the number of levels decreases is smaller than that immediately before. Accordingly, the memory system 100 can restore the value of the coding rate to a value greater than the value immediately before the number of levels decreases.

The memory mode can be changed for each arbitrary unit. The coding rate can be changed for each arbitrary unit. For example, it is assumed herein that the changing of the memory mode and the changing of the coding rate are performed for each block. That is, the memory controller 2 stores a current coding rate and a current memory mode for each block. For example, the memory controller 2 stores information in which the current coding rate and the current memory mode are recorded for each block in the RAM 22 and updates the information. The memory controller 2 may save the information into the NAND memory 1 at the time of power-off and load the information into the RAM 22 from the NAND memory 1 at the time of power-on. The changing of the memory mode and the changing of the coding rate may be performed every plural blocks. The unit for changing the memory mode and the unit for changing the coding rate may not be equal to each other. It is assumed herein that the changing of the coding rate and the changing of the memory mode are performed by the CPU 24 (by firmware). That is, the CPU 24 manages the information in which the current coding rate and the current memory mode are recorded for each block. The management include updating, saving, and loading. The changing of the coding rate or the changing of the memory mode may be performed by another hardware in place of the CPU 24.

The memory mode is changed, for example, in the order of the QLC, the TLC, the MLC, and the SLC. At the first time, each block may be used in a memory mode other than the QLC. At the first time, each block may be used as a memory mode having the larger number of levels than that in the QLC. The changing order is not limited to the above-mentioned order. So long as the memory mode is changed at least between a first mode and a second mode having the smaller number of levels than that in the first mode, the number of modes and the changing order are not limited to the above-mentioned.

Figure 5:
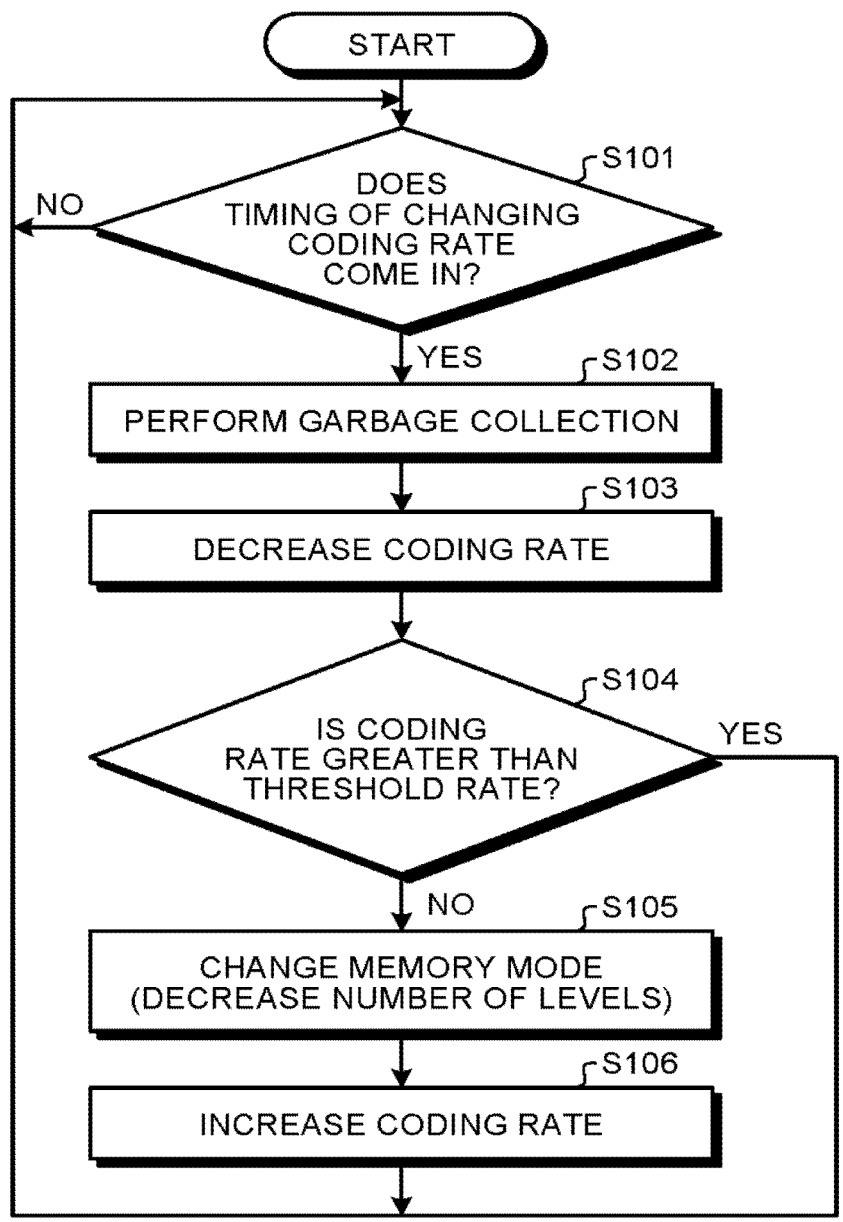
FIG. 5 is a flowchart illustrating an operation of the memory system according to the first embodiment.

The operation of the memory system 100 according to the first embodiment will be described below. FIG. 5 is a flowchart illustrating the operation of the memory system 100 according to the first embodiment. The process illustrated in FIG. 5 is performed for each block.

First, the CPU 24 determines whether a changing timing of the coding rate comes in (S101). The process of S101 can be arbitrarily designed depending on the method of controlling the coding rate. For example, the CPU 24 determines whether the evaluation value satisfies the rate changing condition. When the evaluation value satisfies the rate changing condition, the CPU 24 determines that the changing timing of the coding rate comes in. When the evaluation value does not satisfy the rate changing condition, the CPU 24 determines that the changing timing of the coding rate does not come in.

When the changing timing of the coding rate does not come in (S101, NO), the CPU 24 performs the process of S101 again. When the changing timing of the coding rate comes in (S101, YES), the CPU 24 performs garbage collection on a target block (S102). After the target block becomes a free block by the garbage collection, the CPU 24 changes the coding rate for the target block to a value smaller than the current coding rate (S103).

The garbage collection refers to a process of transferring (copying) at least valid data from one block as a source to an empty area of another block and then regarding all data stored in the source block to be invalid. The source block is regarded as a free block after the garbage collection. Each free block is in a state in which no data is stored and new data is programmable by performing the erasing thereon.

After the process of S103, the CPU 24 determines whether the changed coding rate is greater than a threshold rate (S104). When the changed coding rate is greater than the threshold rate (S104, YES), the CPU 24 performs the process of S101 again. When the changed coding rate is not greater than the threshold rate (S104, NO), the CPU 24 changes the memory mode for the target block to a memory mode having the smaller number of levels than that in the current memory mode (S105). The CPU 24 also changes the coding rate for the target block to a greater value (S106). For example, the CPU 24 changes the coding rate for the target block to a value greater than the value before the process of S103. For example, this value is a default value of the coding rate in the changed memory mode. In this embodiment, the determination result of S104 is negative when the coding rate is equal to the threshold rate. However, the determination result of S104 may be positive when the coding rate is equal to the threshold rate.

The CPU 24 performs the process of S101 again after the process of S106.

When the changing timing of the coding rate comes in (S101, YES), the CPU 24 may not perform the process of S102 necessarily at once. The CPU 24 may perform the process of S102 after no empty page is present in the target block.

In the process of S106, the coding rate may be changed to an arbitrary value. For example, the CPU 24 may change the coding rate to an upper limit of the controllable range of the coding rate. In the process of S106, the CPU 24 may change the coding rate to different values by the memory modes.

The threshold rate is mentioned to be the lower limit of the controllable range of the coding rate. An arbitrary value in the controllable range of the coding rate may be employed as the threshold rate. Different values by the memory modes may be employed as the threshold rate. When the memory mode is changed, the size of an available storage area decreases. The size of the available storage area refers to an amount of net user data which can be writable to the NAND memory 1 which are not yet coded. Such a value of the coding rate that the size of the available storage area is the same when the memory mode is changed and when only the coding rate is changed can be employed as the threshold rate.

The CPU 24 is mentioned to change the value of the coding rate to a value greater than the value immediately before decreasing the number of levels. The CPU 24 may not necessarily change the value of the coding rate with the decrease in the number of levels.

As described above, according to the first embodiment, the memory controller 2 controls the coding rate, sets the memory mode to a first mode, and changes the memory mode to a second mode having the smaller number of levels than that in the first mode when the coding rate is less than the threshold rate. Accordingly, a usable period of the memory system 100 becomes longer than that in a case in which the memory mode is fixed to the first mode.

The memory controller 2 restores the coding rate to a greater value by changing the memory mode from the first mode to the second mode. Accordingly, it is possible to improve an over-provisioned percentage in comparison with a case in which the coding rate is not restored.

(Second Embodiment)

In a memory system 100 according to a second embodiment, the memory controller 2 can group plural blocks into a single logical block. Each block of the NAND memory 1 belongs to any one logical block. There may be a block which does not belong to any logical block. The memory controller 2 erases data for each logical block. The CPU 24 performs garbage collection for each logical block. For example, the plural blocks constituting a logical block are included in the memory chips 11 connected to different channels, respectively.

Figure 6:
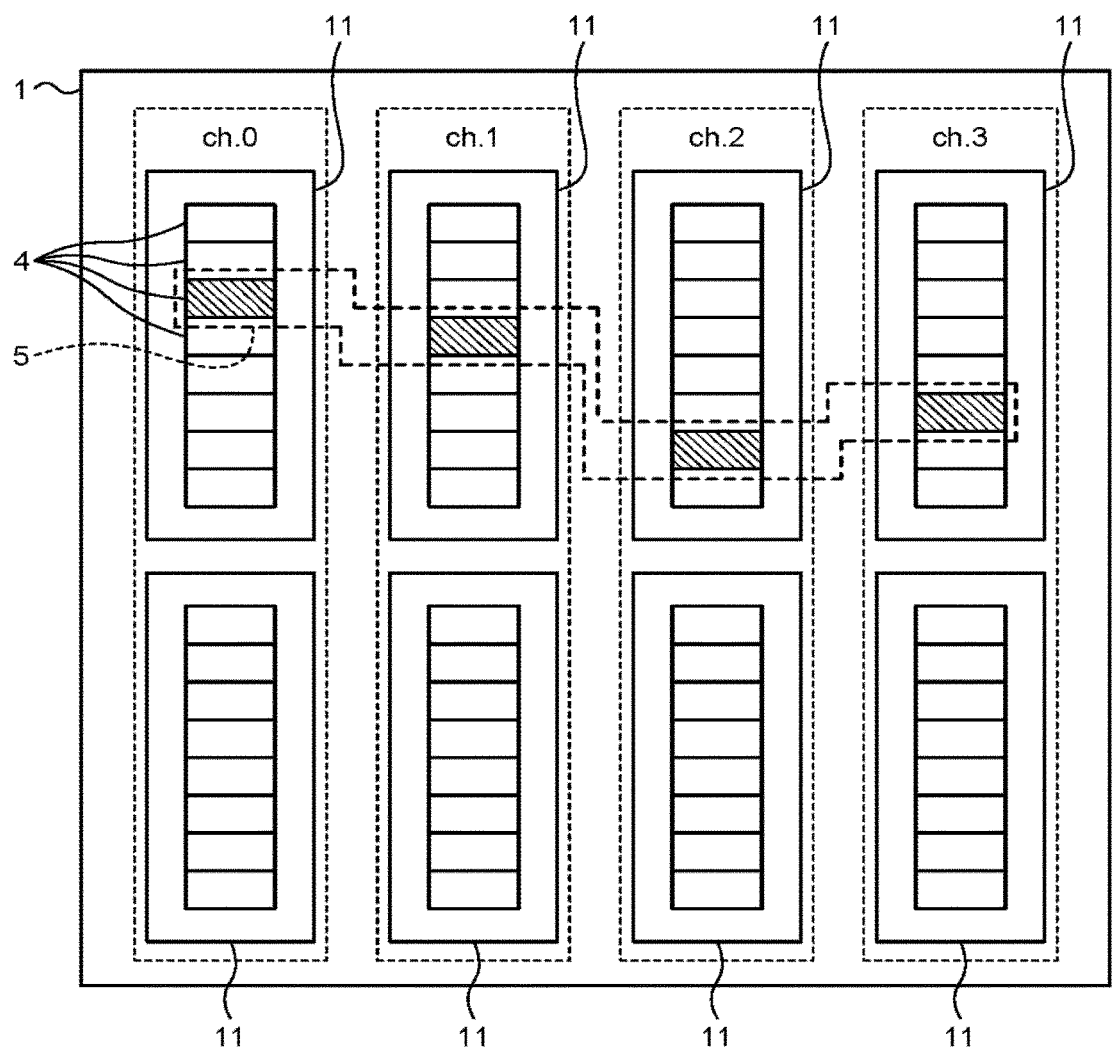
FIG. 6 is a diagram illustrating an example of a configuration of a logical block according to a second embodiment.

FIG. 6 is a diagram illustrating an example of a configuration of a logical block according to the second embodiment. Four hatched blocks 4 illustrated in FIG. 6 constitute a single logical block 5. The relative positions of the blocks 4 constituting the single logical block 5 from the heads may be different as illustrated in FIG. 6.

The CPU 24 may recombine the blocks 4 constituting the logical block 5. The CPU 24 constructs the logical block 5 with plural blocks 4 having the same memory mode.

Figure 7:
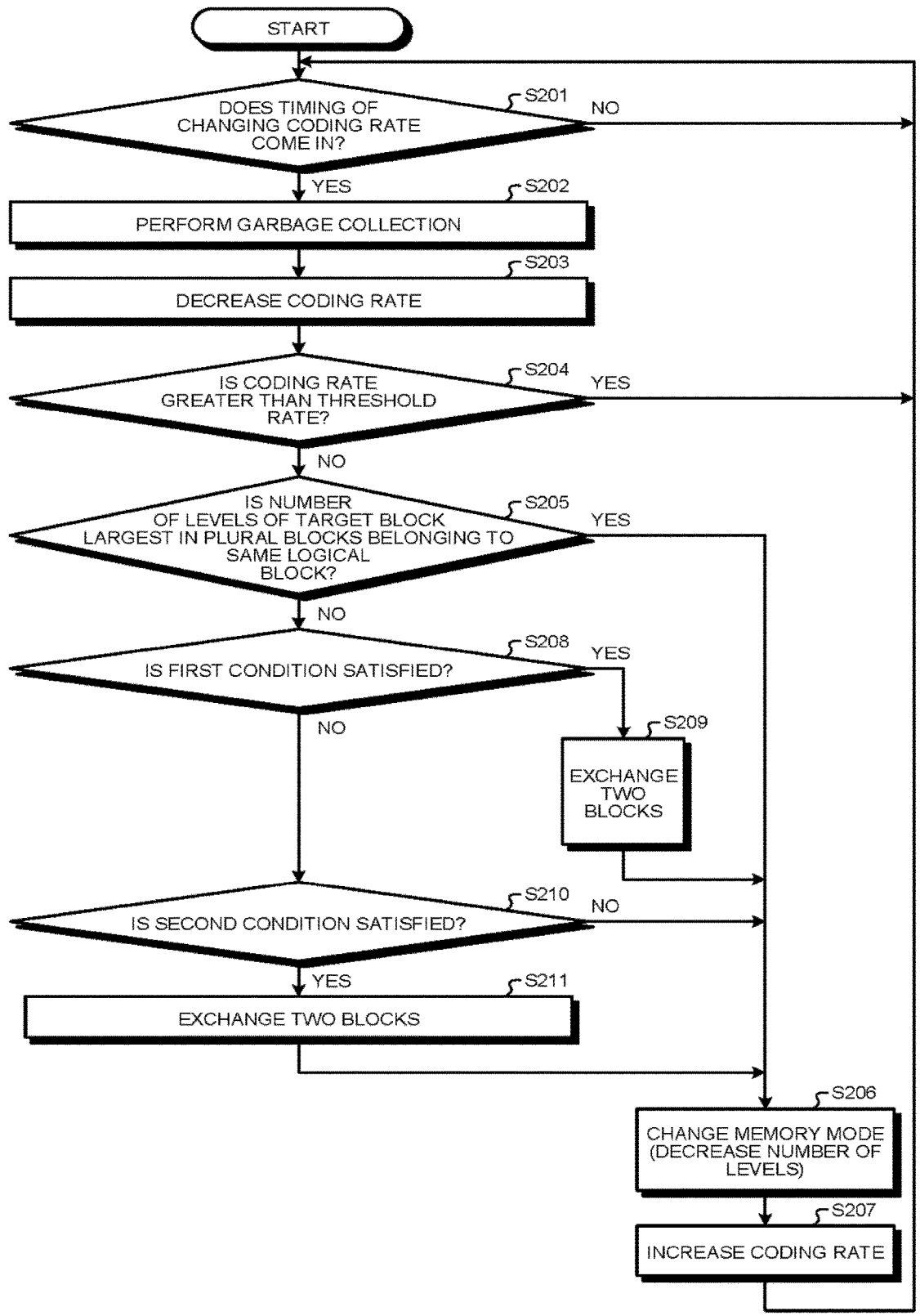
FIG. 7 is a flowchart illustrating an operation of a memory system according to the second embodiment.

FIG. 7 is a flowchart illustrating the operation of the memory system 100 according to the second embodiment. The process of FIG. 7 is performed for each block 4.

The CPU 24 performs the same processes as S101 to S104 in S201 to S204. Accordingly, detailed description of the processes of S201 to S204 will not be repeated. In the second embodiment, the garbage collection is performed on the logical block 5 including a target block 4.

After the process of S204, the CPU 24 determines whether the target block 4 has the maximum number of levels among the plural blocks 4 belonging to the same logical block 5 (S205). When the number of levels of the target block 4 is the maximum among the plural blocks 4 belonging to the same logical block 5 (S205, YES), the CPU 24 changes the memory mode of the target block to a memory mode having the smaller number of levels than that in the current memory mode (S206). For example, the CPU 24 decreases the number of levels by 1. The CPU 24 changes the coding rate for the target block to a value greater than the current coding rate (S207). After the process of S207, the CPU 24 performs the process of S201.

When the number of levels of the target block 4 is not the maximum among the plural blocks 4 belonging to the same logical block 5 (S205, NO), the CPU 24 determines whether a condition (first condition) that there is a block 4 in which a memory mode having the number of levels equal to or greater than the number of levels of the target block is set among unused blocks 4 included in the memory chips 11 connected to the same channel as the target block 4 is satisfied (S208). The unused block 4 refers to a block 4 which is not used. The unused block 4 does not belong to any logical block 5.

When the first condition is satisfied (S208, YES), the CPU 24 exchanges the target block 4 with the unused block 4 by changing the configuration of the logical block 5 including the target block 4 (S209). The target block 4 is handled as an unused block 4 after the process of S209. After the process of S209, the CPU 24 performs the process of S206.

When the first condition is not satisfied (S208, NO), the CPU 24 determines whether a second condition is satisfied (S210).

Here, the satisfaction of the second condition refers to satisfaction of both Condition (1) and Condition (2).

(1) A condition that there is a block 4 in which a memory mode having the number of levels equal to or greater than the number of levels of a target block 4 is set among blocks 4 which are included in the memory chips 11 connected to the same channel as the target block and which constitute a free logical block 5.

(2) A condition that the number of blocks 4 in which a memory mode having the number of levels equal to or greater than the number of levels of the target block 4 is set among the plural blocks 4 of the free logical block 5 is less than the number of blocks 4 in which a memory mode having the number of levels equal to or greater than the number of levels of the target block 4 is set among the plural blocks 4 of the logical block 5 to which the target block 4 belongs.

A free logical block refers to a logical block 5 which is subjected to the garbage collection and which is not assigned as a writing target after the garbage collection is performed. When an unused block 4 included in the memory chips 11 connected to the same channel as the target block 4 is not present, the CPU 24 determines that the first condition is not satisfied.

When the second condition is satisfied (S210, YES), the CPU 24 exchanges the target block 4 with the block 4 included in the memory chips 11 connected to the same channel as the target block 4 among the plural blocks 4 of the free logical block by changing the configuration of the logical block 5 including the target block 25 and the configuration of the free logical block (S211). After the process of S211, the CPU 24 performs the process of S206.

When the second condition is not satisfied (S210, NO), the CPU 24 performs the process of S206. When a block 4 which is included in the memory chips 11 connected to the same channel as the target block 4 and which constitutes the free logical block is not present, the CPU 24 determines that the second condition is not satisfied.

According to the process illustrated in FIG. 7, the memory modes of the plural blocks 4 constituting the same logical block 5 are likely to be the same memory mode. That is, it is possible to construct a logical block 5 using plural blocks 4 having as the same memory mode as possible.

In the above description, the CPU 24 is described to change the memory mode for each block 4. The CPU 24 may change the memory mode for each logical block 5. In this case, the memory modes of the plural blocks 4 included in the same logical block 5 are necessarily the same. The CPU 24 may change the coding rate for each logical block 5.

As described above, according to the second embodiment, the memory controller 2 groups plural blocks 4 into a logical block 5. Then, the memory controller 2 constructs the logical block 5 using the plural blocks 4 having the same memory mode. A logical block 5 including plural blocks 4 not having the same memory mode may be present.

Each element of a logical block 5 is described to be a block 4 included in the memory chips 11 which are connected to different channels. Each element of a logical block 5 may be two or more blocks 4 included in the memory chips 11 connected to different channels as long as the number of blocks 4 of each element is constant. When the memory modes of all the blocks 4 included in a logical block are the same and the numbers of blocks 4 in the elements are the same, the storage capacity for each channel included in a single logical block 5 is constant in channels and thus the access efficiency is improved.

Alternatively, as long as the memory modes of all the blocks 4 are the same, a logical block 5 may be constructed using any method.

When the memory modes of the blocks 4 in the logical block 5 are changed, the memory controller 2 may exchange a block to be changed 4 with a block 4 (corresponding block 4) having the same memory mode as the memory mode of the block to be changed 4 before being changed among other blocks 4 which are accessed via the same channel as the block to be changed 4. That is, the memory controller 2 excludes the block to be changed 4 from the logical block 5 and adds the corresponding block 4 to the logical block 5. Accordingly, the memory modes of the blocks 4 in the logical block 5 can be made to be the same.

(Third Embodiment)

In a third embodiment, the CPU 24 can combine plural blocks 4 belonging to the same channel and treat the combined blocks as a single block 4 at the time of constructing a logical block 5. In other words, an element of a single logical block 5 may include plural blocks 4. A block 4 formed by combining plural blocks 4 is referred to as a combined block.

Figure 8:
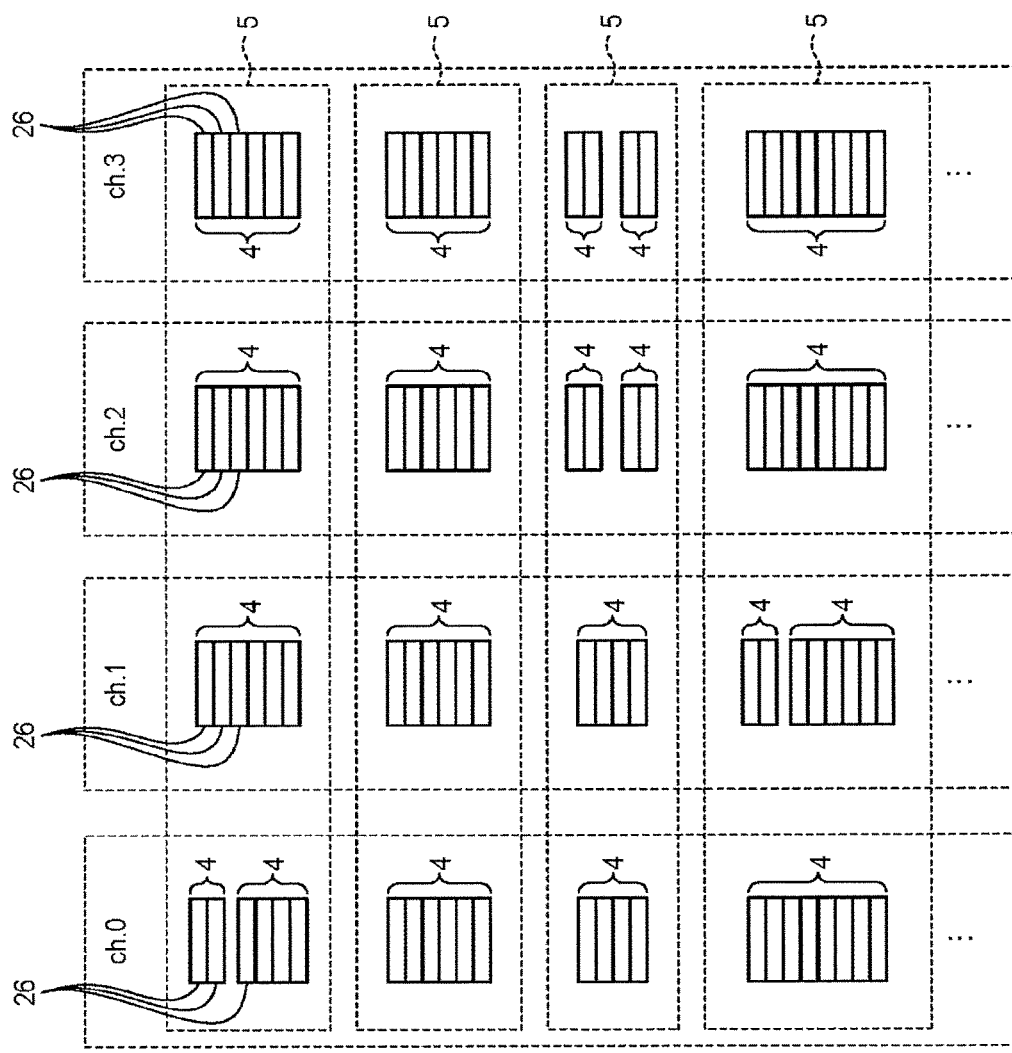
FIG. 8 is a diagram illustrating an example of a configuration of a logical block according to a third embodiment.

FIG. 8 is a diagram illustrating an example of a configuration of a logical block 5 according to the third embodiment. The storage capacity of a block 4 is proportional to the number of levels. That is, a block 4 in a QLC memory mode has four times the storage capacity of a block 4 in an SLC memory mode. A block 4 in a TLC memory mode has three times the storage capacity of a block 4 in an SLC memory mode. A block 4 in an MLC memory mode has two times the storage capacity of a block 4 in an SLC memory mode. In the drawing, for the purpose of simplification of description, it is assumed that a block 4 in the SLC has a size of two pages, a block 4 in the MLC has a size of four pages, and a block 4 in the TLC has a size of six pages. Reference numeral 26 denotes a page. As illustrated in FIG. 8, a combination of plural blocks 4 connected to the same channel can constitute an element of a logical block 5. That is, each element of a logical block 5 is one block 4 or one combined block.

By using a combined block as an element of a logical block 5, the CPU 24 can set the elements of the logical block 5 to have the same storage capacity.

It is described herein that a block 4 in the SLC memory mode can be combined with a block 4 in another memory mode, but blocks 4 in a memory mode other than the SLC memory mode may be combined. It is described herein that two blocks 4 can constitute one combined block, but three or more blocks 4 may constitute one combined block.

Figure 9:
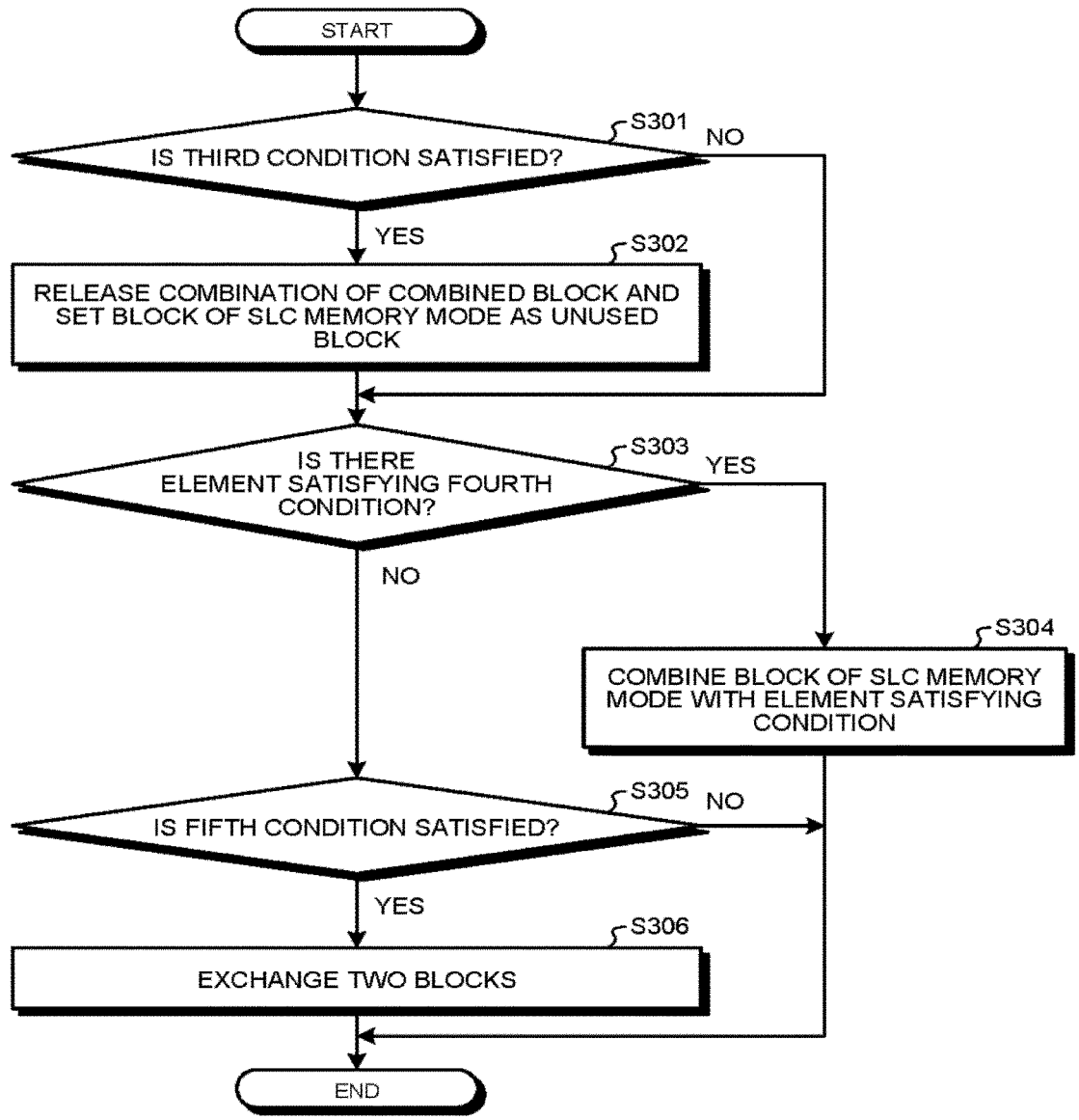
FIG. 9 is a flowchart illustrating an operation of recombining a logical block.

FIG. 9 is a flowchart illustrating an operation of recombining a logical block 5. This operation is performed on a logical block 5 in a free logical block state. For example, this operation is performed on a logical block 5 in a free logical block state including a target block 4 after the memory mode is changed. For example, in FIG. 9, a target block 4 is a block 4 of which the memory mode has been changed and is a block 4 included in a logical block 5 in a free logical block state. The logical block 5 to which the target block 4 belongs is referred to as a target logical block 5.

First, the CPU 24 determines whether a condition (third condition) that only one element having maximum storage capacity is present among the elements of the target logical block 5 and the element having maximum storage capacity is a combined block is satisfied (S301). When the third condition is satisfied (S301, YES), the CPU 24 releases combination of the combined block which is the element having maximum storage capacity and sets a block 4 in the SLC memory mode which is formed by the releasing of combination as an unused block 4 (S302).

When the third condition is not satisfied (S301, NO) or after the process of S302, the CPU 24 determines whether an element satisfying a fourth condition is present (S303).

Here, the fourth condition includes Condition (3), Condition (4), and Condition (5).

(3) A condition that an element is other than the element having maximum storage capacity among the elements of the target logical block 5.

(4) A condition that an unused block 4 in the SLC memory mode included in the memory chips 11 connected to the same channels is present.

(5) A condition that an element is not a combined block.

When an element satisfying the fourth condition is present (S303, YES), the CPU 24 combines the element satisfying the fourth condition with an unused block 4, which is different from the element, in the SLC memory mode included in the memory chips 11 connected to the same channel (S304). When plural elements satisfying the fourth condition are present, the CPU 24 performs the process of S304 on each element satisfying the fourth condition.

When an element satisfying the fourth condition is not present (S303, NO), the CPU 24 determines whether a condition (fifth condition) that only one element having maximum storage capacity is present among the elements of the target logical block 5 and an unused block 4 which is included in the memory chips 11 connected to the same channel as the element having maximum storage capacity and of which the storage capacity is not less than the storage capacity of an element having second maximum storage capacity among the elements of the target logical block 5 is present is satisfied (S305). When the fifth condition is satisfied (S305, YES), the CPU 24 exchanges the element having maximum storage capacity among the elements of the target logical block 5 with the unused block 4 which is included in the memory chips 11 connected to the same channel as the element having maximum storage capacity and of which the storage capacity is not less than the storage capacity of an element having second maximum storage capacity among the elements of the target logical block 5 by changing the configuration of the target logical block 5 (S306).

When the fifth condition is not satisfied (S305, NO), the CPU 24 ends the operation of recombining the logical block 5 after the process of S304 or after the process of S306.

As described above, the memory controller 2 may construct a logical block 5 with a combination of plural blocks as an element. The memory controller 2 groups plural elements having the same storage capacity into a logical block 5.

(Fourth Embodiment)

Figure 10:
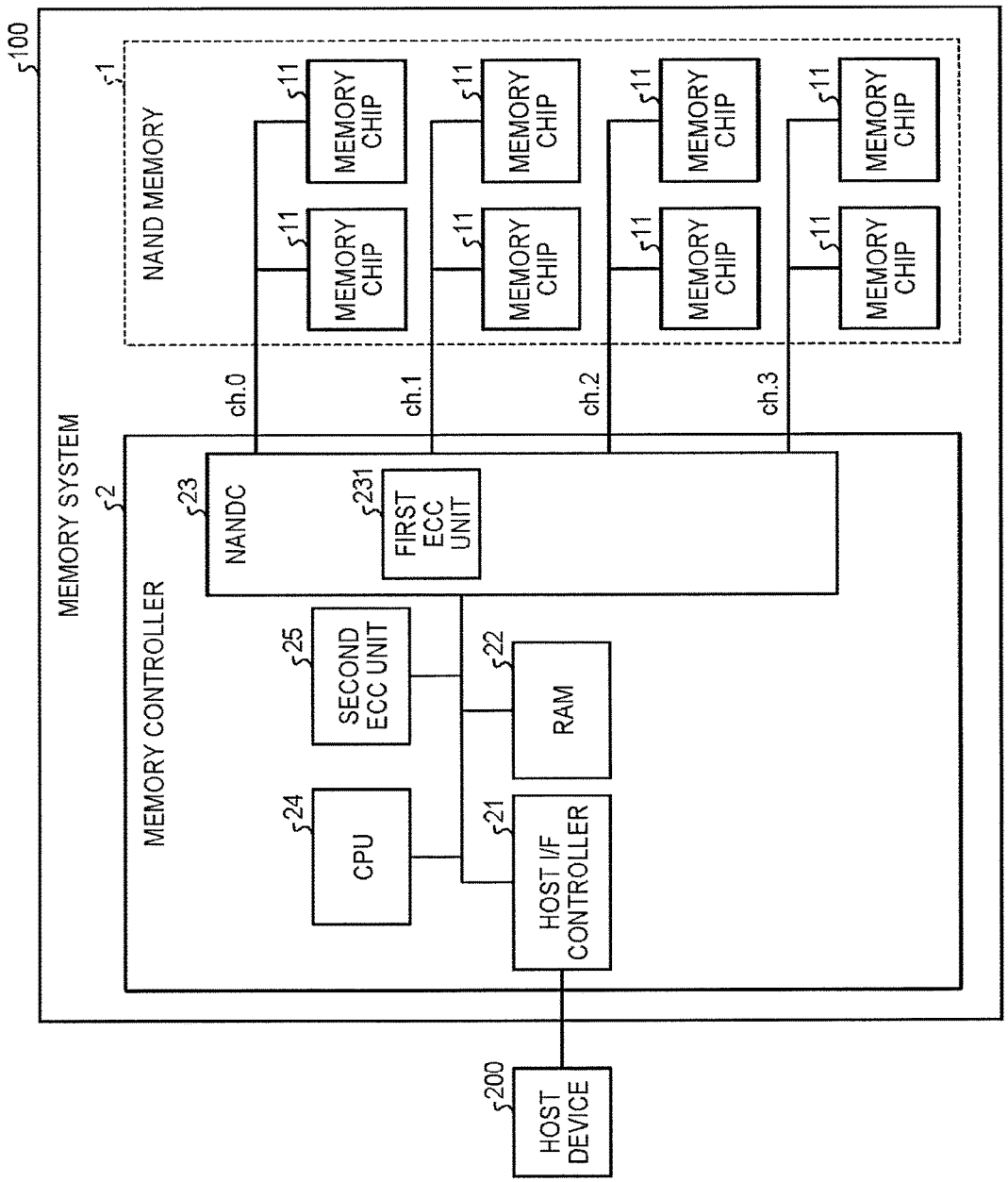
FIG. 10 is a diagram illustrating an example of a configuration of a memory system according to a fourth embodiment.

FIG. 10 is a diagram illustrating an example of a configuration of a memory system according to a fourth embodiment. Here, elements having the same forms and functions as in the first embodiment will be referenced by the same names and reference numerals as in the first embodiment and description thereof will not be repeated. The fourth embodiment can be applied to the memory system 100 according to the second embodiment or the third embodiment.

The memory system 100 according to the fourth embodiment further includes a second ECC unit 25 in the memory controller 2. The second ECC unit 25 may be included in the NANDC 23. The second ECC unit 25 is a hardware circuit realizing a second error correcting function. The correction capability of the second ECC unit 25 is higher than that of the first ECC unit 231. The second ECC unit 25 performs error correction using inter-channel parity. That is, a frame (second frame) for the error correction in the second ECC unit 25 includes plural pieces of data which are programmed in plural different storage areas and the plural storage areas are storage areas in different elements of the same logical block 5. Here, a storage area is, for example, a page. The storage area may be a unit area other than a page. The storage area may be a unit area smaller than a page. For example, the parity of the second frame is stored in any one storage area in a logical block 5 including plural storage areas constituting the second frame.

Figure 11:
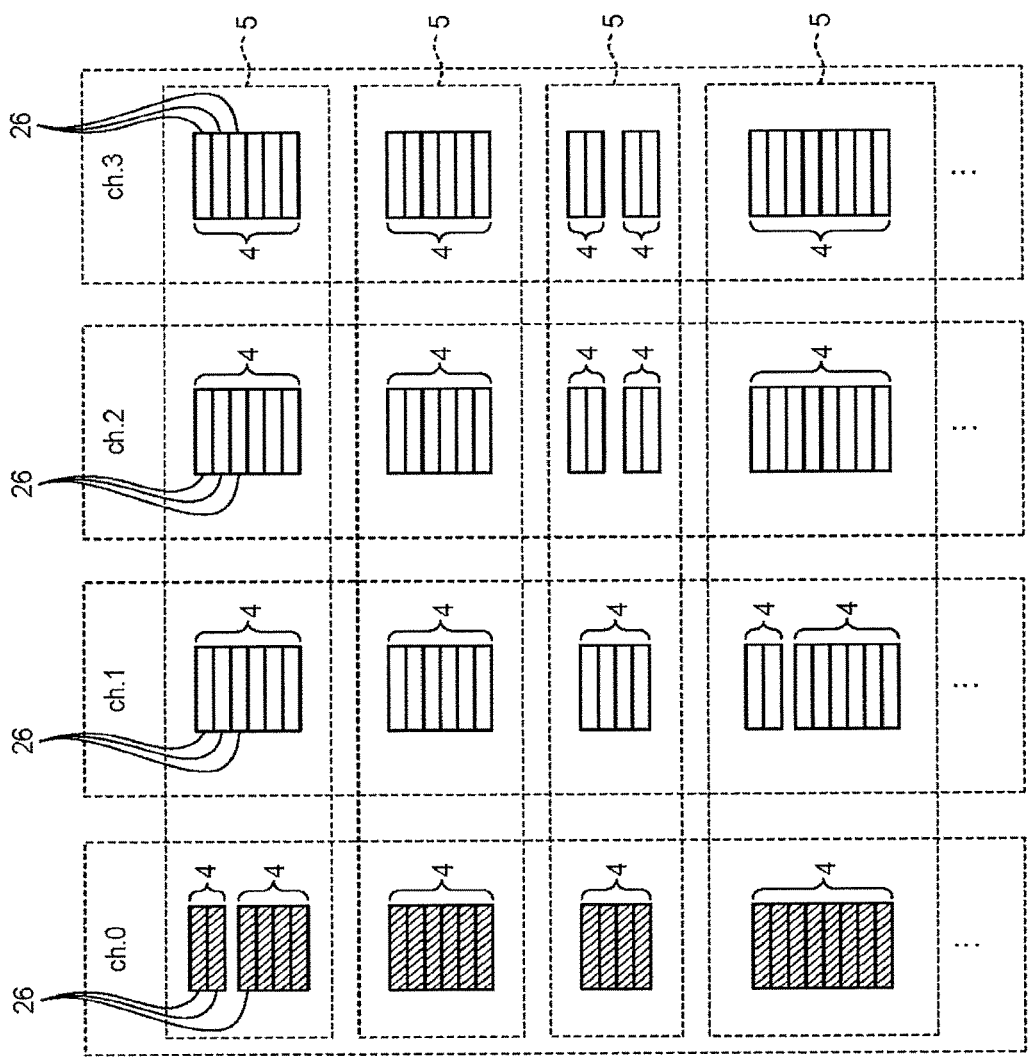
FIG. 11 is a diagram illustrating an example of a position at which parity is stored in the memory system according to the fourth embodiment.

FIG. 11 is a diagram illustrating an example of positions at which the parity of the second frame is stored in the memory system 100 according to the fourth embodiment. Hatched pages 26 denote pages 26 in which the parity is stored. According to the memory system 100 to which the second embodiment or the third embodiment is applied, elements of a logical block 5 can be set to have the same storage capacity in the same logical block 5. Accordingly, since the number of storage areas constituting the second frame can be made to be as equal to the maximum number as possible, it is possible to set a ratio of capacity required for storing the parity to the total capacity to be as small as possible. The parity of the second frame may not be stored in the same channel.

(Fifth Embodiment)

An over-provisioned percentage also decreases with a decrease in the coding rate or a decrease in the number of levels. According to a fifth embodiment, a memory system 100 calculates an over-provisioned percentage and transmits a notification message to the host 200 when the over-provisioned percentage is less than a certain value. The host 200 reduces an address space of the memory system 100 in response to the received notification message.

Figure 12:
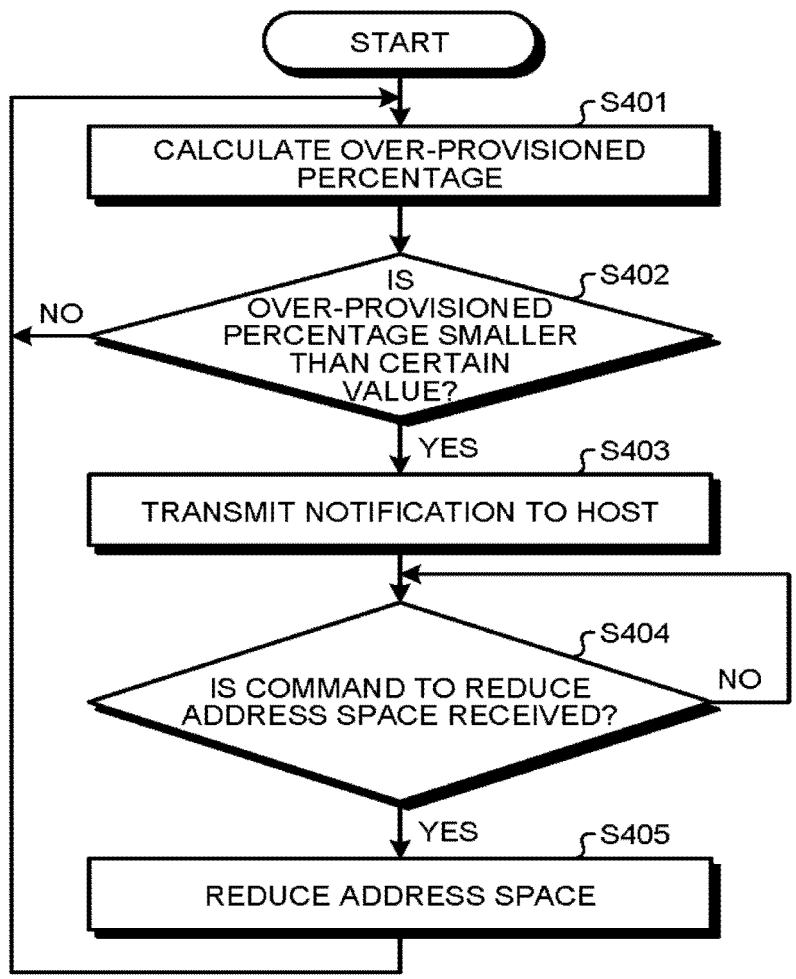
FIG. 12 is a diagram illustrating an operation of a memory system according to a fifth embodiment.

FIG. 12 is a diagram illustrating an operation of the memory system 100 according to the fifth embodiment. In the memory system 100, the CPU 24 calculates an over-provisioned percentage (S401). The CPU 24 determines whether the over-provisioned percentage is less than a certain value (S402). When the over-provisioned percentage is less than the certain value (S402, YES), the CPU 24 transmits a notification message to the host 200 (S403). When the over-provisioned percentage is not less than the certain value (S402, NO), the CPU 24 performs the process of S401 again.

After transmitting the notification message, the CPU 24 determines whether a command to reduce an address space is received (S403). When the command to reduce an address space is received (S404, YES), the CPU 24 reduces the address space instructed by the command (S405) and performs the process of S401 again. When the command to reduce an address space is not received (S404, NO), the CPU 24 performs the process of S404 again.

Figure 13:
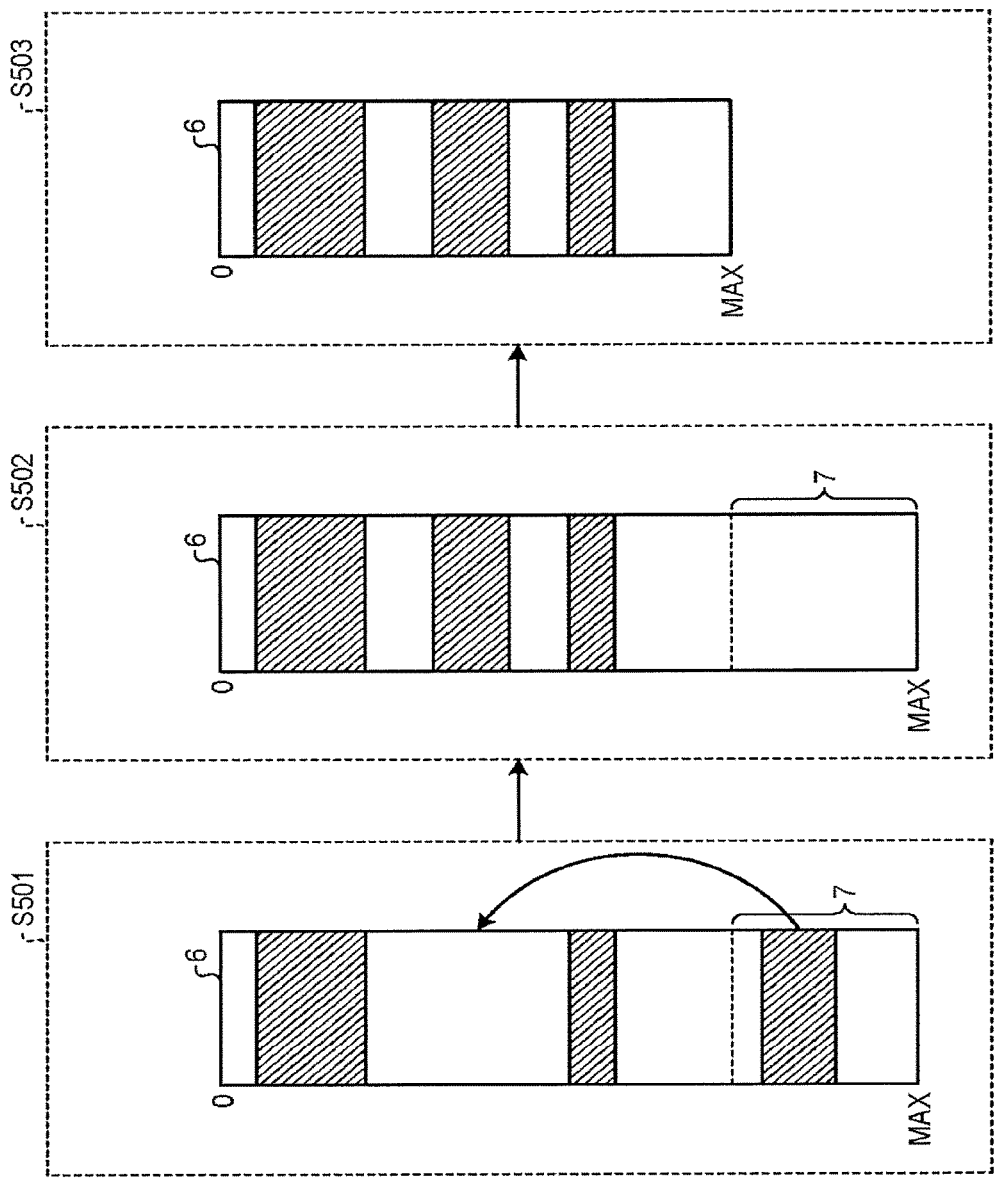
FIG. 13 is a diagram illustrating an example of a method of reducing an address space.

FIG. 13 is a diagram illustrating an example of the method of reducing an address space. An element denoted by reference numeral 6 indicates an address space of a target memory system 100. The upper end of the address space 6 indicates a head of the address space (that is, a position at which a logical address has "0" as a minimum value) and the lower end of the address space 6 indicates a tail of the address space 6 (that is, a position at which a logical address has "MAX" as a maximum value). Hatched areas indicate areas in which data is stored. In the example illustrated in FIG. 13, the host 200 deletes the tail area of the address space 6. The host 200 transfers data in the area to be deleted 7 to another area before reducing the address space 6 (S501). For example, the host 200 reads data in the area to be deleted 7 by issuing a reading command, and writes the read data to another area by issuing a writing command. A destination may be an area other than the area to be deleted 7 in the memory system 100 of which the address space 6 will be reduced or an area in another memory system 100. When unnecessary data is present in the area to be deleted 7, the host 200 may not transfer the unnecessary data. When the transferring is completed, no data is stored in the area to be deleted 7 (S502). The host 200 deletes the area to be deleted 7 by transmitting a command to reduce the address space 6 to the memory system 100 (S503). The over-provisioned percentage is restored by reducing the address space 6. The command to reduce the address space 6 may include size information of the area to be deleted 7. The command to reduce the address space 6 may include a head position of the area to be deleted 7.

Figure 14:
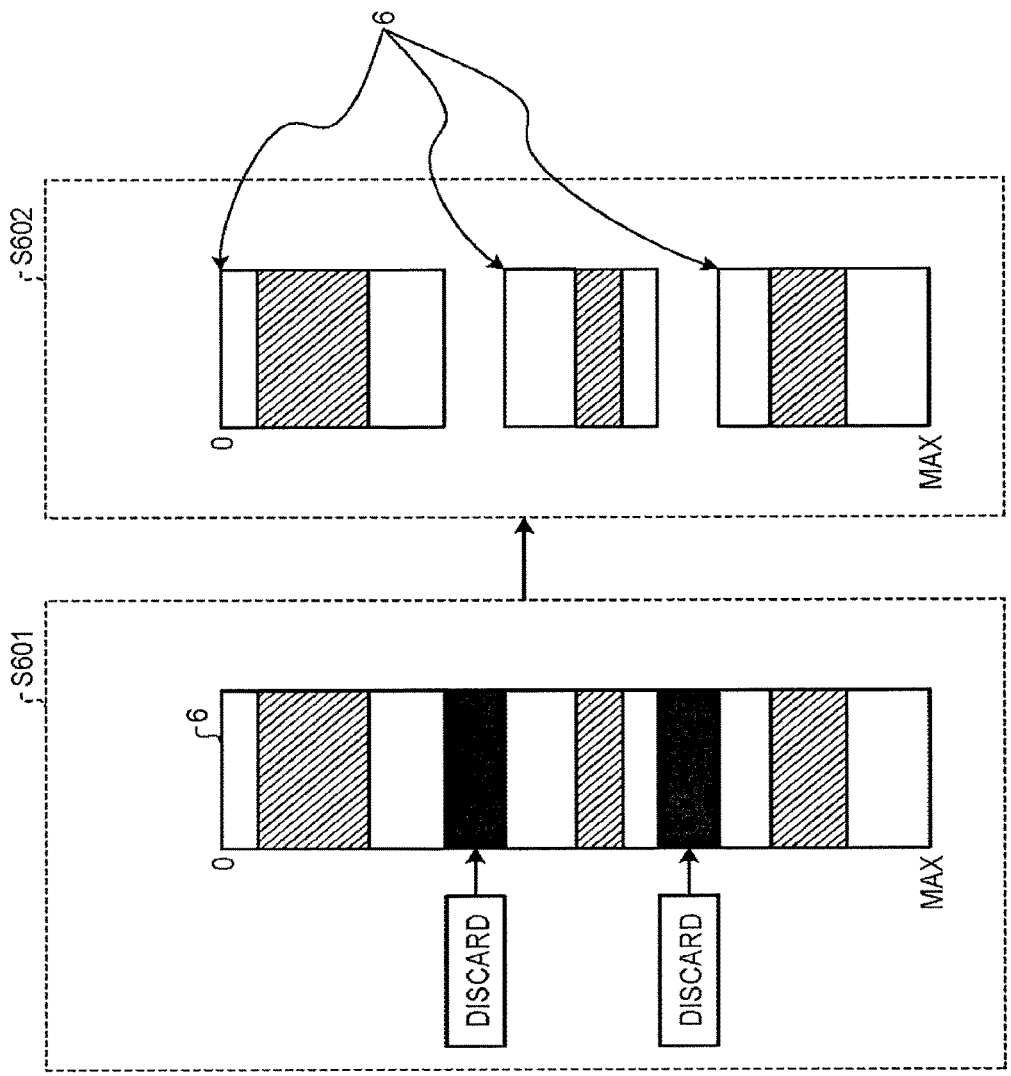
FIG. 14 is a diagram illustrating another example of the method of reducing an address space.

FIG. 14 is a diagram illustrating another example of the method of reducing an address space. When an unused area is present in the address space 6, the host 200 discards the area (S601). Accordingly, the discarded area in the address space 6 is considered to be deleted (S602). When the address space 6 is reduced using this method, continuity of logic addresses in the reduced address space 6 is not guaranteed.

Alternatively, in another example of the method of reducing an address space, the host 200 transmits a command to designate one or more areas and to perform an UNMAP process to the memory system 100. The UNMAP process is a process of releasing a correlation of a logical address and a physical address. A target area of the UMMAP process may store data or may not store data. Subsequently, the host 200 designates a degree of reduction Vred and transmits a command to reduce an address space. The host 200 can designate a size smaller than the total size Vunmap of the area subjected to the UNMAP process as the degree of reduction. The host 200 can newly write data to an area having a size of (Vunmap-Vred) in the area subjected to the UNMAP process. The CPU 24 may give a warning to the host 200 when it is intended to write data having a size equal to or greater than (Vunmap-Vred) to the area subjected to the UNMAP process.

As described above, the memory controller 2 calculates an over-provisioned percentage and transmits a notification message to the host 200 when the over-provisioned percentage is less than a certain value. The host 200 can reduce an address space of the memory system 100 in response to the received notification message. Accordingly, it is possible to use the memory system 100 longer in comparison with a case in which an address space is not reduced.

For example, when NVMe (registered trademark) is employed as a communication interface standard between the memory system 100 and the host 200, the memory system 100 can provide plural logical address spaces which are identified by name space numbers. Each of the plural logical address spaces is referred to as a name space. The host 200 may reduce an address space of a desired name space.

(Sixth Embodiment)

A technique called dynamic wear leveling of actively making a block 4 having a smaller degree of wearing be a free block by copying data stored in a block 4 having a smaller degree of wearing to a block 4 having a greater degree of wearing when the degree of wearing varies between blocks 4 is known. According to the dynamic wear leveling, it is possible to decrease the difference in a degree of wearing between the blocks 4 to be as small as possible.

In the sixth embodiment, the degree of wearing is calculated using a function having a memory mode (that is, the number of levels) and a coding rate as variables. According to this function, when the coding rate has the same value, the smaller the number of levels becomes, the larger the degree of wearing becomes. According to this function, when the number of levels has the same value, the smaller the coding rate becomes, the larger the degree of wearing becomes.

The CPU 24 calculates a degree of wearing for each block 4 using the function and performs the above-mentioned dynamic wear leveling on the basis of the calculated degree of wearing.

In the dynamic wear leveling, the CPU 24 may select a block 4 which has a small degree of wearing and in which a time elapsed after data is programmed after the newest erasing is as long as possible as a block 4 of a copy source. That is, the CPU 24 may select a block 4 as a copy source on the basis of the degree of wearing and the time elapsed after data is programmed after the newest erasing. The CPU 24 may select a block 4 as a copy source on the basis of an erasing frequency (count).

The CPU 24 may perform the dynamic wear leveling for each logical block 5. In the dynamic wear leveling, the CPU 24 calculates a degree of wearing for each logical block 5 and performs data copy between the logical blocks 5 on the basis of the calculated degree of wearing. Any calculation method can be employed as a method of calculating a degree of wearing for each logical block 5. Any calculation method can be employed as a method of calculating a logical block 5 including a combined block.

As described above, in the dynamic wear leveling, the memory controller 2 calculates a degree of wearing for each block 4 on the basis of the function having the memory mode and the coding rate as variables and transfer data between the blocks 4 on the basis of the degree of wearing. Alternatively, in the dynamic wear leveling, the memory controller 2 calculates a degree of wearing for each logical block 5 on the basis of the function having the memory mode and the coding rate as variables and transfers data between the logical blocks 5 on the basis of the degree of wearing. Accordingly, since the degree of wearing in consideration of the memory modes are smoothed between the plural blocks 4 of the memory system 100, it is possible to extend a life span of each block 4 of the memory system 100 to be as long as possible.

(Seventh Embodiment)

Figure 15:
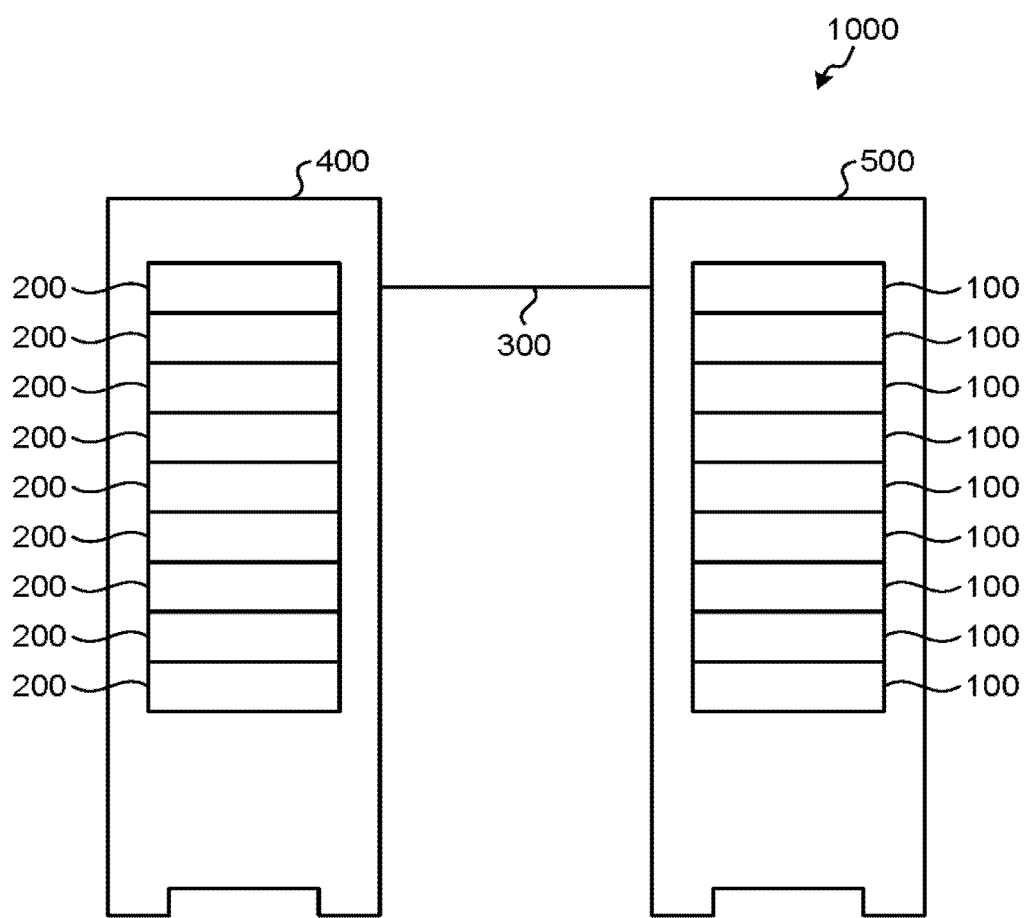
FIG. 15 is a diagram illustrating a mounting example in memory systems.

FIG. 15 is a diagram illustrating an example in which memory systems 100 are mounted. The memory systems 100 are mounted on, for example, a server system 1000. The server system 1000 includes a rack mount server 400 and a disk array 500, and the rack mount server 400 and the disk array 500 are connected to each other via a communication interface 300. Any standard can be employed as the standard of the communication interface 300. The rack mount server 400 includes a server rack, and one or more hosts 200 are mounted on the server rack. Each host 200 can access the disk array 500 via the communication interface 300.

The disk array 500 includes a server rack, and one or more memory systems 100 are mounted on the server rack. One or more hard disk drive units in addition to the memory system 100 may be mounted on the disk array 500. Each memory system 100 can execute a command from each host 200. Each memory system 100 has a configuration according to any one of the first to sixth embodiments or a combination thereof. Accordingly, each memory system 100 can be used as long as possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory configured to include a plurality of memory cells which are writable in a memory mode among memory modes including a first mode and a second mode, the first mode being a mode in which a value of a first number of bits is written to a memory cell among the plurality of memory cells, the second mode being a mode in which a value of a second number of bits is written to a memory cell among the plurality of memory cells, the second number of bits is smaller than a number of bits included in the first number of bits;
an error correcting circuit that performs error correction; and
a processor configured to set the first mode as the memory mode of the plurality of memory cells, write data to the plurality of memory cells in the first mode, read the data from the plurality of memory cells, cause the error correcting circuit to perform the error correction on the data read from the plurality of memory cells, decrease a coding rate for the error correction of the plurality of memory cells on the basis of result of the error correction, and change the memory mode of the plurality of memory cells from the first mode to the second mode in a case where the coding rate for the error correction of the plurality of memory cells is less than a first threshold, the coding rate for the error correction of the plurality of memory cells being a ratio of a size of the data before being coded to a size of the data after being coded.

2. The memory system according to claim 1, wherein the processor is configured to change the coding rate for the error correction of the plurality of memory cells to a value greater than the first threshold in response to changing the memory mode of the plurality of memory cells from the first mode to the second mode.

3. The memory system according to claim 2, wherein the processor is configured to change the coding rate for the error correction of the plurality of memory cells to a smaller value in response to an increase in the number of errors included in the data read from the plurality of memory cells.

4. The memory system according to claim 1, wherein the memory includes a plurality of blocks, and
the processor is configured to set the memory mode of the plurality of memory cells in units of the block.

5. The memory system according to claim 4 wherein the processor is further configured to group a first number of blocks having the same memory mode among the plurality of blocks into a first logical block.

6. The memory system according to claim 5, wherein the memory includes a plurality of memory chips each includes a second number of blocks among the plurality of blocks,
the processor is further configured to include a plurality of channels, each of the plurality of channels being connected to a portion of the plurality of memory chips, the portion being different for each channel,
the first number of blocks includes at least one first block which is accessed via a first channel among the plurality of channels and at least one second block which is accessed via a second channel of the plurality of channels, the second channel being different from the first channel, and
the processor is further configured to, in response to changing the memory mode of the first block, exclude the first block from the first logical block and adds a third block to the first logical block, the third block being a block which is accessed via the first channel and in which the memory mode equal to the memory mode of the first block before changing the memory mode is set and being different from the first block.

7. The memory system according to claim 5, wherein the processor is further configured to group a plurality of elements having the same storage capacity into a second logical block, the plurality of elements being one or more blocks among the plurality of blocks.

8. The memory system according to claim 7, wherein the memory includes a plurality of memory chips each includes a second number of blocks among the plurality of blocks,
the processor is further configured to include a plurality of channels, each of the plurality of channels being connected to a portion of the plurality of memory chips, the portion being different for each channel,
the first number of blocks includes at least one first block which is accessed via a first channel among the plurality of channels and at least one second block which is accessed via a second channel of the plurality of channels, the second channel being different from the first channel, and
a first element of the plurality of elements is a combination of a third block and a fourth block, accessed via the first channel, and different from the first block.

9. The memory system according to claim 7, wherein the processor is further configured to construct a plurality of third logical blocks, the plurality of third logical blocks including the first logical block and the second logical block, calculate a degree of degradation for respective third logical blocks by using a function having the memory mode and the coding rate for the error correction of the plurality of memory cells as variables, and transfer data between the third logical blocks on the basis of the calculated degree of degradation.

10. The memory system according to claim 9, wherein the processor is further configured to transfer data stored in a fourth logical block of the plurality of third logical blocks to a fifth logical block of the plurality of third logical blocks, the fifth logical block having a larger degree of degradation than that of the fourth logical block.

11. The memory system according to claim 1, wherein an over-provisioned percentage decreases in accordance with changing the coding rate for the error correction of the plurality of memory cells or changing the memory mode, and
in a case where the over-provisioned percentage is less than a second threshold, the processor is further configured to transmit a notification to a host.

12. A control method of a memory system including a nonvolatile memory including a plurality of memory cells, the control method comprising:
setting a first mode as a memory mode of plurality of memory cells, the first mode being a mode in which a value of a first number of bits is written to a memory cell among the plurality of memory cells;
writing data to the plurality of memory cells in the first mode;
reading the data from the plurality of memory cells;
performing error correction on the data read from the plurality of memory cells;
decreasing a coding rate for the error correction of the plurality of memory cells on the basis of result of the error correction on the basis of result of the error correction, the coding rate for the error correction of the plurality of memory cells being a ratio of a size of the data before being coded to a size of the data after being coded; and
changing the memory mode of the plurality of memory cells from the first mode to a second mode in a case where the coding rate for the error correction of the plurality of memory cells is less than a first threshold, the second mode being a mode in which a value of a second number of bits is written to a memory cell among the plurality of memory cells, the second number of bits is smaller than a number of bits included in the first number of bits.

13. The control method according to claim 12, further comprising changing the coding rate for the error correction of the plurality of memory cells to a value greater than the first threshold in response to changing the memory mode of the plurality of memory cells from the first mode to the second mode.

14. The control method according to claim 13, further comprising changing the coding rate for the error correction of the plurality of memory cells to a smaller value in response to an increase in the number of errors included in the data read from the plurality of memory cells.

15. The control method according to claim 12, wherein the memory includes a plurality of blocks, and
the control method further comprises setting the memory mode of the plurality of memory cells in units of the block.

16. The control method according to claim 15, further comprising grouping a first number of blocks having the same memory mode among the plurality of blocks into a first logical block.

17. The control method according to claim 16, further comprising grouping a plurality of elements having the same storage capacity into a second logical block, each of the plurality of elements being one or more blocks among the plurality of blocks.

18. The control method according to claim 17, further comprising:

constructing a plurality of third logical blocks, the plurality of third logical blocks including the first logical block and the second logical block;

calculating a degree of degradation for respective third logical blocks by using a function having the memory mode and the coding rate for the error correction of the plurality of memory cells as variables; and transferring data between the third logical blocks on the basis of the calculated degree of degradation.

19. The control method according to claim 18, wherein the transferring of data includes transferring data stored in a fourth logical block of the plurality of third logical blocks to a fifth logical block of the plurality of third logical blocks, the fifth logical block having a larger degree of degradation than that of the fourth logical block.

20. The control method according to claim 12, wherein an over-provisioned percentage decreases in accordance with changing the coding rate for the error correction of the plurality of memory cells or changing the memory mode, and the control method further comprises, in a case where the over-provisioned percentage is less than a second threshold, transmitting a notification to a host.

\* \* \* \* \*